United States Patent [19]
Xu et al.

[11] Patent Number: 6,084,347
[45] Date of Patent: Jul. 4, 2000

[54] MULTICOLORED ORGANIC ELECTROLUMINESCENT DISPLAY

[75] Inventors: Ji-Hai Xu, Gilbert; Song Q. Shi, Phoenix, both of Ariz.

[73] Assignee: Motorola, Inc., Schaumburg, Ill.

[21] Appl. No.: 09/049,532

[22] Filed: Mar. 27, 1998

[51] Int. Cl.$^7$ ...................................................... B32B 9/00
[52] U.S. Cl. ......................... 313/503; 313/504; 313/112
[58] Field of Search .................................. 313/504, 503, 313/112; 428/690, 917

[56] References Cited

U.S. PATENT DOCUMENTS

| | | | |
|---|---|---|---|
| 5,015,000 | 5/1991 | Imai et al. | 340/702 |
| 5,126,214 | 6/1992 | Tokailin et al. | 313/504 X |
| 5,294,870 | 3/1994 | Tang et al. | 313/504 |
| 5,705,285 | 1/1998 | Shi et al. | 313/504 X |

Primary Examiner—Ashok Patel
Attorney, Agent, or Firm—Eugene A. Parsons; William E. Koch

[57] ABSTRACT

An organic electroluminescent display device includes a plurality of pixels formed on a substrate, each pixel including a plurality of different light influencing elements disposed on the substrate. Deposited atop each light influencing element is an organic electroluminescent display element which is adapted to emit light of a preselected wavelength. A layer of an insulating, planarizing material is disposed between the light influencing elements and the OED. Each of the light influencing elements is adapted to generate a different effect in response to light of a preselected wavelength incident thereon. In this way, it is possible to achieve a red, green, blue organic electroluminescent display assembly using a single organic electroluminescent display device.

8 Claims, 1 Drawing Sheet

MULTICOLORED ORGANIC ELECTROLUMINESCENT DISPLAY

TECHNICAL FIELD

This invention relates in general to flat panel information display devices, and in particular to light emitting organic electroluminescent information devices for use in displays.

BACKGROUND OF THE INVENTION

Until fairly recently, the preferred, indeed the only means by which to display information in the electronic medium was to use a video monitor including a cathode ray tube ("CRT"). CRT technology has been well known for over 50 years, and has gained widespread commercial acceptance in applications ranging from desktop computer modules to home televisions and industrial applications. CRTs are essentially large vacuum tubes having one substantially planar surface upon which information is displayed. Coated on the inside of the CRT planar surface is a layer of phosphors which respond by emitting light when struck by electrons emitted from the electron gun of the CRT. The electron gun is disposed in an elongated portion which extends away from the inside of the CRT display surface.

While CRTs are widely used in numerous applications, there are several inherent limitations to the application of CRT technology. For example, CRTs are relatively large and consume a great deal of energy. Moreover, as they are fabricated of glass, the larger the display surface, the heavier the CRT. Given the need for the electron gun to be spacedly disposed from the phosphors on the surface of the display surface, CRTs have a substantial depth dimension. Accordingly, CRTs have little use in small and portable applications, such as handheld televisions, laptop computers, and other portable electronic applications which require the use of displays.

To answer the needs of the marketplace for smaller, lighter, more portable display devices, manufacturers have created numerous types of flat panel display devices. Examples of flat panel display devices include active matrix liquid crystal displays (AMLCD's), plasma displays, and electroluminescent displays. Each of these types of displays has use in a particular market application, though each is accompanied by various limitations which make them less than ideal for certain applications. Principal limitations inherent in devices such as AMLCD's relate to the fact that they are fabricated predominantly of inorganic semiconductor materials by semiconductor fabrication processes. These materials and processes are extremely expensive, and due to the complexity of the manufacturing process, cannot be reliably manufactured in high yields. Accordingly, the costs of these devices are very high with no promise of immediate cost reduction.

One preferred type of device which is currently receiving substantial research effort is the organic electroluminescent device. Organic electroluminescent devices ("OED") are generally composed of three layers of organic molecules sandwiched between transparent, conductive and/or metallic conductive electrodes. The three layers generally include an electron transporting layer, an emissive layer, and a hole transporting layer. Charge carriers specifically, electrons and holes, are generated in the electron and hole transporting regions, respectively. Electrons are negatively charged atomic particles and holes are the positively charged counterparts. The charge carriers are injected into the emissive layer, where they combine, emitting light. OED's are attractive owing to their thin profile, light weight, and low driving voltage, i.e., less than about 20 volts. Hence, they have a potential application as full color flat emissive displays.

One of the serious drawbacks attributable to OED's has been the difficulty encountered in achieving full color, i.e., red, green, blue ("RGB") display devices. This is owing to the fact that different organic materials will emit light at different wavelengths, and hence, different colors. For example, finding EL materials which provide outstanding red and blue colors with high color purity has heretofore been extremely difficult with the materials that have been available.

In view of the fact that emissive materials that can provide the desired colors have been difficult to identify, routineers in the field have attempted to augment the OED's with other devices so as to achieve the desired colors. For example, in U.S. Pat. No. 5,015,999 there is disclosed an OED device which emits radiation in the ultraviolet portion of the electromagnetic spectrum. This ultraviolet radiation is then passed through a filter which fluoresces blue light in response to the ultraviolet light generated by the OED. Approaches of this type have several limitations to their successful implementation. First, and foremost is the fact that there is not commercially available any OED which reliably emits radiation in the ultraviolet region. Moreover, devices such as those described in the '999 patent do not appear to be able to provide RGB display devices.

U.S. Pat. No. 5,126,214 discloses a device in which an OED emits light in the blue portion of the electromagnetic spectrum. This blue light is then passed through a fluorescent device so as to generate a RGB display. Likewise, U.S. Pat. No. 5,294,870 generates blue light from an OED, passing the same through an RGB fluorescent filter. Both types of devices, however, are limited by the fact that blue emitting organic electroluminescent displays have a limited thermal stability window, and poor efficiency. Moreover, devices such as those disclosed in the '214 patent appear to be characterized by limited lumous efficiency, i.e., a maximum on the order of approximately 2.55 foot lamberts per watt ("1 m/W").

In U.S. Pat. No. 5,705,285, issued Jan. 1, 1998, and entitled "Multicolored Organic Electroluminescent Display", an organic electroluminescent full color display by a combination of a blue/green emitting OED with pixelated blue, green absorption filters and red fluorescent filter is disclosed. This device overcomes some of the above problems but still leaves room for improvement.

Accordingly, there exists a need for a display device capable of reliably providing full color information thereon. The device should make use of a stable organic electroluminescent display element properly modified to provide red, green, and blue light as desired. Moreover, the display should be pixelated in order to assure high resolution information display.

The objective of the present invention is to further improve the performance of the full color OED display.

BRIEF DESCRIPTION OF THE DRAWINGS

The accompanying drawings, which are incorporated in and constitute a part of the specification, illustrate preferred embodiments of the invention, and together with the detailed description of the preferred embodiments given below, serve to explain the principles of the invention. Since device feature dimensions are often in sub-micrometer ranges, the drawings are scaled for ease of visualization rather than dimensional accuracy.

DETAILED DESCRIPTION OF THE PREFERRED EMBODIMENTS

Figure 1:
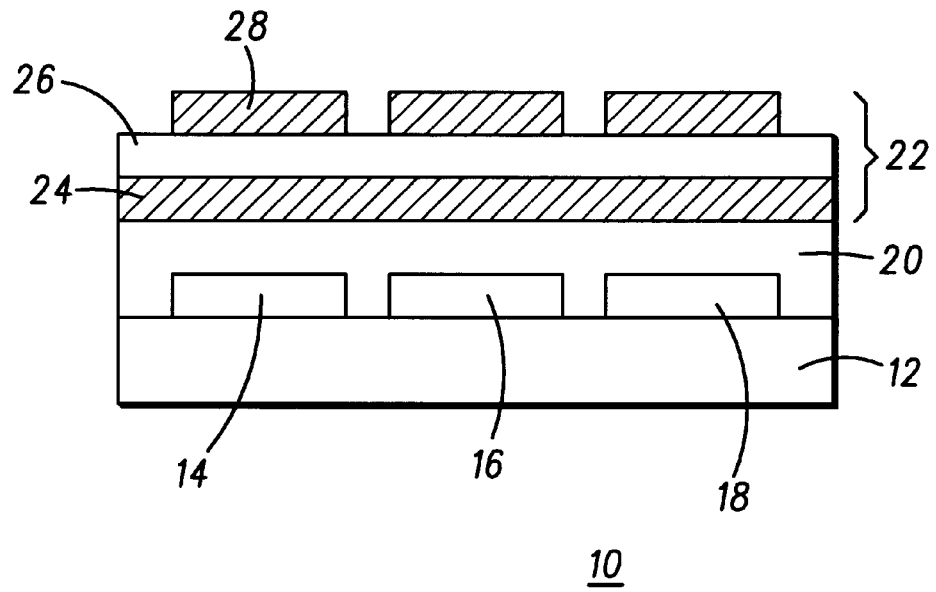
FIG. 1 is a cross-sectional view of a full color organic electroluminescent display assembly in accordance with the instant invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated a cross-sectional view of a single display pixel 10 in a multi-color organic electroluminescent display assembly or device. Pixel 10 is fabricated upon a first substrate 12, which is transparent and which may be fabricated of any of a number of known materials employed in the art. Examples of materials from which substrate 12 may be fabricated include, but are not limited to, glass, such as Corning 7059 glass, soda line glass, transparent plastic substrates made of polyolefins, polyethersulfones, polyarylates, and combinations thereof. In one preferred embodiment, the substrate 12 is fabricated of a high quality glass such as Corning 7059 glass appropriate for use in flat panel display applications.

Disposed atop one major surface of display substrate 12 is a plurality of light influencing elements 14, 16 and 18. The light influencing elements are adapted to change or otherwise alter the character of light passing therethrough. Accordingly, light influencing elements may be selected from a number of different devices adapted for such purpose, examples of which include light filters, polarizers, lenses such as Fresnel lenses, elements which fluoresce in response to a particular wavelength of light incident, and combinations thereof. In the embodiment of FIG. 1, the light influencing elements 14, 16 and 18, are adapted to filter light of a preselected wavelength in such a manner so as to provide red, green, and blue light at the outlets or output side.

In a preferred embodiment of the instant invention therefore, the first light influencing element 14 is a fluorescing element which is adapted to absorb light having a wavelength of between approximately 4000 Å and 6000 Å and fluoresce light having a wavelength of 6000 Å to 7000 Å in response thereto. Accordingly, element 14 absorbs the blue and green portions of the received blue/green light (for reasons which will be explained in greater detail hereinbelow) and fluoresces red light.

Similarly, light influencing element 16 is a fluorescing element which is adapted to receive light having a wavelength of between approximately 4000 Å and 6000 Å and fluoresce light having a wavelength of 4800 Å to 6000 Å in response thereto. Accordingly, element 16 absorbs the blue portion of the received blue/green light, passes the green portion of the received blue/green light and fluoresces green light.

Conversely, light influencing element 18 is a light filtering element adapted to allow only light having a wavelength of between approximately 4200–5000 Å to pass therethrough, filtering out light of other wavelengths. The net result is that only blue light can pass through light influencing element 18.

Thus, in a preferred embodiment light influencing elements 14, 16 and 18 receive blue/green light having a wavelength of between approximately 4000 Å and 6000 Å. Light influencing element 14 absorbs the blue/green light and fluoresces red light. Light influencing element 16 absorbs the blue portion of the blue/green light, passes the green portion, and fluoresces green light, to further enhance green light production. Light influencing element 18 absorbs, or filters out, the green portion of the blue/green light and passes the blue light.

Deposited atop light influencing elements 14, 16, and 18 is a layer 20 of insulating, planarizing material. Insulating planarizing layer 20 is provided so as to ensure a relatively smooth surface upon which a subsequent organic electroluminescent display device will be deposited. Planarizing layer 20 also protects the underlying light influencing elements 14, 16 and 18 from being damaged or deformed during the following processes. In this regard, planarizing layer 20 is fabricated of any of a number of materials known in the art. Preferred materials for planarizing layer 20 include organic monomers or polymers that can be polymerized and/or crosslinked after deposition to generate a rigid surface. Silicon oxide prepared by sol-gel process can also be used as planarizing layer 20.

Alternatively, planarizing layer 20 may be a second sheet of substrate material such as that disclosed hereinabove with respect to substrate 12. In this embodiment, the light influencing elements 14, 16 and 18, would then be sandwiched between the two layers of substrates 12 and 20.

Deposited atop planarizing layer 20 on the side thereof opposite light influencing elements 14, 16 and 18, is an organic electroluminescent display device (OED) 22 aligned with the underlying light influencing elements 14, 16, and 18. In a preferred embodiment, OED 22 is adapted to emit light having a wavelength of between 4000 and 6000 Å. It is well known in the art that light having a wavelength of between 4000 Å and 6000 Å is a blue/green light. Accordingly, it may now be appreciated that emitted light having this wavelength and striking light influencing elements 14, 16, and 18 results in element 14 fluorescing red light, element 16 fluorescing green light, and element 18 fluorescing blue light. Blue/green light having a wavelength of between 4000 Å and 6000 Å applied to element 18, for example, which allows only light having a wavelength of between 4200 Å and 5000 Å to pass through, will result in the emitted light being essentially blue, as the entire green component is filtered out. It thus becomes apparent that the pixel 10 is capable of providing red light from light influencing element 14, green light from light influencing element 16 and blue light from light influencing element 18.

In order to achieve an organic electroluminescent display device 22 capable of emitting light having a wavelength of between 4000 Å and 6000 Å, one must simply fabricate an OED as is well known in the art. Specifically, an organic electroluminescent display device comprises an organic electroluminescent medium sandwiched between two electrically conductive electrodes, at least one of which is semi-transparent to transparent to visible light. The organic electroluminescent medium in the embodiment may include a plurality of layers of organic materials as exemplified in the following, although a single layer of organic materials may be used as disclosed in copending U.S. patent application entitled "Organic Electroluminescent Device With Continuous Organic Medium", Ser. No. 08/893,116, filed Jul. 15, 1997, and assigned to the same assignee. It is well known in the art that in a passive driving display device, both electrically conductive electrodes must be patterned to form a x-y addressable matrix; in a active driving display device, only one of the electrodes needs to be patterned. The multicolor OED display device disclosed in the invention may be driven by either a passive or active driving scheme, although only a passive driven OED is presented for example.

Accordingly, an electrode 24 is deposited atop planarizing layer 20. Electrode 24 is patterned in laterally-spaced rows in the final display and aligned with the underlying light influencing elements 14, 16 and 18. Electrode 24 may be fabricated of, for example, conducive metal oxides, such as indium oxides, indium tin oxide (ITO), zinc oxide, zinc tin oxide, conductive transparent polymers such as polyaniline and combinations thereof. Alternatively, electrode 24 may be fabricated of a semi-transparent metal, examples of which include a thin layer (i.e. on the order of less than 500 Å) of gold, copper, silver, and combinations thereof.

Thereafter, an organic electroluminescent medium 26 is deposited on top of electrode 24 and part of planarizing layer 20. Following, is a description of layers of organic materials which may be included in medium 26.

A first layer of organic material is deposited atop electrode 24 and part of planarizing layer 20. The first layer includes an organic material adapted to accept holes from electrode 24, the holes being for subsequent recombination with electrons in the emitter layer described hereinbelow. The hole injecting layer also acts as a buffer layer to match the thermal and mechanical properties of the first electrode and the subsequent layers of organic materials. One hole injecting layer which may preferably be used herein is disclosed in, for example, U.S. Pat. Nos. 3,935,031 and 4,356,429.

Thereafter, deposited atop the hole injecting layer is a hole transporting layer. The purpose of the hole transporting layer is to facilitate transport of holes from the hole injecting layer to the emitter layer where they are combined with electrons to create photons for the emission of light. A preferred hole transporting material for use in the hole transporting layer is typically characterized by a glass transition temperature of more than 75° C. and preferably more than about 95° C. The hole transporting material may be selected from the group of materials consisting of:

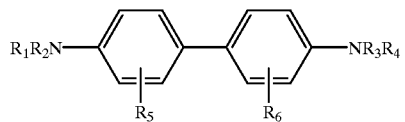

(Formula I)

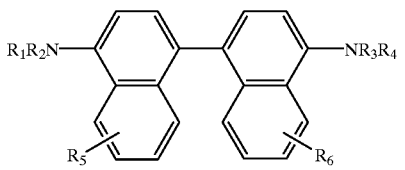

(Formula II)

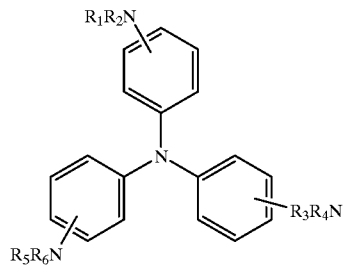

(formula III)

wherein $R_1$ and $R_2$, $R_3$, $R_4$, $R_5$, and $R_6$ each independently represent a hydrogen atom, an alkyl group of 1–6 carbons, a halogen group, a cyano group, a nitro group, a aryl group of 6–15 carbons, a fused aromatic group, an alkylamine group, an aryloxy group, and arylamine group, and combinations thereof. In one preferred embodiment, the hole transporting material is specifically selected from the group consisting of 4,4'-bis(N-(1-naphthyl)-N-phenyl amino)-biphenyl, 4,4'-bis(N-(2-naphthyl)-N-phenyl amino)-binaphthyl, 1,3,5-tris(N(1-naphthyl)-N-phenyl amino) benzene, and combinations thereof.

Thereafter deposited atop the hole transporting layer is a layer of emitter material. The layer of emitter material typically includes a host emitting matrix and a guest emitter. The host emitting matrix is fabricated of an organic material adapted to accommodate both holes and electrons, and then transfer the excited state energies to the guest emitter where the holes and electrons combine and emit a photon of light causing a visible change in the appearance of the OED to a viewer thereof. The materials that can be used in the host emitter matrix include a metal chelated oxinoid compound disclosed in, for example, U.S. Pat. Nos. 4,769,292, and 5,529,853 as well as organometallic complexes disclosed in commonly assigned, co-pending U.S. patent application Ser. No. 08/304,451, filed Sep. 12, 1994 and entitled "NEW ORGANOMETALLIC COMPLEXES FOR USE IN LIGHT EMITTING DEVICES," the disclosure of which is incorporated herein by reference. Examples of the preferred host emitting matrix materials are selected from the group of tris(8-quinolinol) aluminum, bis(10-oxo-benzo[h] quinoline beryllium, bis(2-(oxy-phenyl) benzoxazole) zinc, bis(2-(2-oxy-phenyl)benzophyoxyl) zinc, and combinations thereof. Materials that can be used as a guest emitter include dies and pigments of high fluorescent efficiency. For efficient energy transfer, it is necessary that the guest emitter material has a band gap no greater than that of the material making up the emitter host matrix. It is therefore preferred that the guest emitter material is present in the concentration of between $10^{-3}$ mole % to 10 mole % based on the moles comprised of the emitting host matrix. The selection of the guest emitting matrix is well known to one of ordinary skill in the art.

Deposited atop the emitter layer is an electron transporting layer fabricated of a material selected from the group disclosed in U.S. Pat. Nos. 4,769,292 or 5,529,853. Alternatively, the material may be such as that disclosed in the aforementioned U.S. patent application Ser. No. 08/304,451, the disclosure of which is incorporated herein by reference. The electron transporting layer, like the hole transporting layer is adapted to gather charge carriers, in this case, electrons, generated in an electron injecting layer for transport to the emitter layer where they are combined with holes as described hereinabove. In this regard, characteristics of an appropriate electron transporting layer include those found in the group of tris(8-quinolinol) aluminum, bis(10-oxo-benzo[h] quinoline beryllium bis(2-(oxy-phenyl) benzoxazole) zinc, bis(2-(2-oxy-phenyl) benzophyoxyl) zinc, and combinations thereof.

Deposited atop the electron transporting layer is an electron injecting layer. The electron injecting layer, like the hole injecting layer, is adapted to accept charge carriers, in this case, electrons. In general, the electron injection layer may be omitted without significant compromise of device performance.

Finally, deposited atop the electron injecting layer is an electrode 28 which is patterned in laterally-spaced columns and aligned with the underlying light influencing elements in the final display. Electrode 28 is typically formed of a metal of work function of less than 4 eV and at least one other protective metal of higher work function. The preferred low work function metal is selected from a group of lithium, magnesium, calcium, strontium, while the preferred high work function metal is selected from a group of aluminum, indium, copper, gold, silver. Electrode 28 can also be formed of an alloy of a lower work function metal and a high work function metal by coevaporation. The content of the low work function metal in electrode 28 can vary from 0.1% to 50%, but is preferably below 20%.

Alternatively, electrode 28 can be a metal of work function of greater than 4 eV such as aluminum, silver etc. when the electron injection layer 24 is composed of alkaline fluoride such as LiF, $MgF_2$ or alkaline oxide such as $LiO_x$, $MgO_x$, $CaO_x$, $CsO_x$.

In operation, holes inject from electrode 24, also known as the anode, and electrons inject from electrode 28, also known as the cathode, into organic electroluminescent medium 26 disposed between electrically conducting electrodes 24 and 28, when an electrical current is applied between electrodes 24 and 28. An electrical current may be applied by connecting the electrode to electrical current generating means (not shown).

Figure 2:
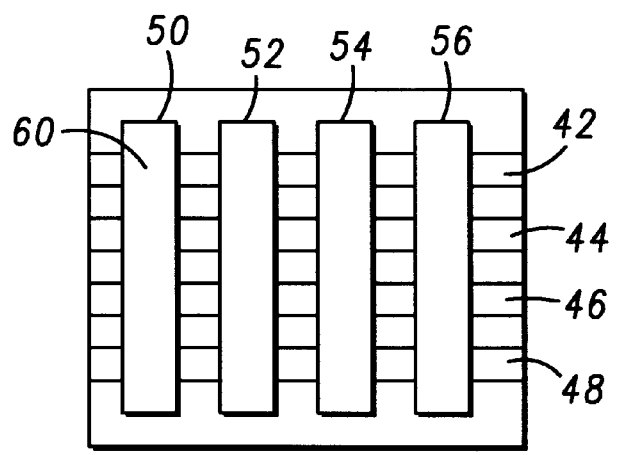
FIG. 2 is a top plan view of a full color organic electroluminescent display assembly in accordance with the instant invention.

Referring now to FIG. 2, there is illustrated therein an array 40 of discrete light-emitting pixels arranged in a plurality of rows and columns, each pixel being substantially similar to that illustrated hereinabove with respect to FIG. 1. Array 40 is an x by y matrix of rows and columns including in the embodiment of FIG. 2, four pixels in each row 42, 44, 46, and 48 and four pixels in each column 50, 52, 54, and 56 yielding a display of 16 pixels. It is to be understood that the subject invention is not so limited. the number of rows and columns and the number of pixels in each row and column may vary according to application. Moreover, pixels need not be necessarily arranged in rows and columns as illustrated herein.

Rows, 42, 44, 46, and 48, are typically fabricated on a common first electrode fabricated of the materials described hereinabove. The first electrode is typically deposited upon the first substrate (e.g. substrate 12 and electrodes 14, 16, and 18 of FIG. 1) by methods and processes well known in the art. Conversely, columns 50, 52, 54, and 56 are defined by single columnar electrodes such as that described hereinabove with respect to electrode 28 in the OED 10. Accordingly, discrete electrodes may be addressed by providing an electrical current along, for example, row 42, and column 50 so that a single pixel 60 is activated by the application of the electrical current.

Thus we have demonstrated a multicolor OED device. Besides the conversion efficiencies of light influencing elements, the overall efficiency of the embodied display device is mainly determined by the efficiency of the blue/green-emitting OED. It is well known to those skilled in the art that a blue/green-emitting OED is generally much more efficient and much easier to achieve than a blue-emitting OED. Furthermore, the thermal stability of a blue/green-emitting OED is generally much better than a blue-emitting OED. A light emitting organic electroluminescent information display device in accordance with the present invention, with stability up to 100° C. and overall efficiency of more than 3.0 lm/W can be readily fabricated.

While preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An array of discrete light emitting pixels arranged in a plurality of rows and columns, and disposed upon a transparent substrate, each light emitting pixel comprising:

an organic electroluminescent light emitting element adapted to emit light of a preselected wavelength;

first, second, and third light influencing elements each positioned to receive the light emitted by the organic electroluminescent light emitting element;

the first light influencing element adapted to absorb light received from the organic electroluminescent light emitting element and to fluoresce light of a first wavelength in response to the absorbed light;

the second light influencing element adapted to absorb a first portion of the light received from said organic electroluminescent light emitting element and to fluoresce light of a second wavelength in response to the absorbed light, and to pass a second portion of the light received from said organic electrolliminescent light emitting element, the second portion being substantially of the second wavelength; and the third light influencing element adapted to filter out a portion of the light received from said organic electroluminescent light emitting element and pass light of a third wavelength.

2. An array as in claim 1, wherein the second light influencing element fluoresces light having a wavelength of between about 4800 Å and 6000 Å.

3. An array as in claim 1, wherein the light emitting element emits light having a wavelength of between 4,000 Å and 6,000 Å.

4. An array as in claim 1, wherein the first light influencing element fluoresces light having a wavelength of between about 6,000 Å and 7,000 Å.

5. An array as in claim 1, wherein the second light influencing element absorbs light having a light transmission wavelength of between about 4,200 Å and 5,000 Å and fluoresces light having a wavelength of between about 4800 Å and 6000 Å.

6. An array as in claim 1, wherein the third light influences element filters out light having a light transmission wavelength of between about 5100 Å and 6,000 Å.

7. An array of discrete light emitting pixels arranged in a plurality of rows and columns, and disposed upon a transparent substrate, each light emitting pixel comprising:

an organic electroluminescent light emitting element adapted to emit light having a wavelength of between 4,000 Å and 6,000 Å;

first, second, and third light influencing elements each positioned to receive the light emitted by the organic electroluminescent light emitting element;

the first light influencing element adapted to absorb light received from said organic electroluminescent light emitting element and, in response to the absorbed light, to fluoresce light having a wavelength of between about 6,000 Å and 7,000 Å;

the second light influencing element adapted to absorb light received from said organic electroluminescent light emitting element having a light transmission wavelength of between about 4,200 Å and 5,000 Å and, in response to the absorbed light, to fluoresce light having a wavelength of between about 4800 Å and 6000 Å, and further to pass light having a wavelength of between 4800 Å and 6000 Å; and the third light influencing element adapted to filter out a portion of the light received from said organic electroluminescent light emitting element having a light transmission wavelength of between about 5100 Å and 6,000 Å and pass a remaining portion having a wavelength of between 4200 Å and 5000 Å.

8. An array of discrete light emitting pixels arranged in a plurality of rows and columns, and disposed upon a transparent substrate, each light emitting pixel comprising:

an organic electroluminescent light emitting element adapted to emit blue/green light;

first, second, and third light influencing elements each positioned to receive the blue/green light emitted by the organic electroluminescent light emitting element;

the first light influencing element adapted to absorb the blue/green light received from the organic electroluminescent light emitting element and, in response to the absorbed blue/green light, to fluoresce substantially red light;

the second light influencing element adapted to absorb a blue portion of the blue/green light received from the organic electroluminescent light emitting element, pass a green portion of the blue/green light emitted from the organic electroluminescent light emitting element, and, in response to the absorbed blue portion of the blue/green light, to fluoresce green light; and the third light influencing element adapted to filter out a green portion of the blue/green light received from the organic electroluminescent light emitting element and pass a blue portion of the blue/green light.

* * * * *